(12) United States Patent
Kawamae et al.

(10) Patent No.: US 6,404,781 B1
(45) Date of Patent: Jun. 11, 2002

(54) DATA TRANSMISSION METHOD FOR EMBEDDED DATA, DATA TRANSMITTING AND REPRODUCING APPARATUSES AND INFORMATION RECORDING MEDIUM THEREFOR

(75) Inventors: Osamu Kawamae, Yokohama; Toshifumi Takeuchi, Ota-ku; Hiroshi Yoshiura, Kawasaki; Takao Arai, Yokohama, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/144,696

(22) Filed: Sep. 1, 1998

(30) Foreign Application Priority Data

| Sep. 2, 1997 | (JP) | ............................................. 9-236709 |
| Oct. 14, 1997 | (JP) | ............................................. 9-280201 |

(51) Int. Cl.$^7$ ................................................. H04J 3/12
(52) U.S. Cl. ...................................... 370/522; 382/115
(58) Field of Search ............................ 386/201, 34, 51; 382/115; 370/522

(56) References Cited

U.S. PATENT DOCUMENTS

| 5,561,724 A | 10/1996 | Kido et al. |
| 5,568,570 A | 10/1996 | Rabbani ...................... 382/238 |

(List continued on next page.)

FOREIGN PATENT DOCUMENTS

| EP | 0581317 | 2/1994 |
| EP | 0612054 | 8/1994 |
| EP | 0651554 | 5/1995 |
| EP | 0766466 | 4/1997 |
| EP | 805600 | 11/1997 |
| EP | 840513 | 5/1998 |
| JP | 66329 | 1/1994 |
| JP | 8161483 | 6/1996 |
| JP | 9130766 | 5/1997 |
| WO | 9520291 | 7/1995 |
| WO | 9625005 | 8/1996 |
| WO | 9636163 | 11/1996 |
| WO | 9641468 | 12/1996 |
| WO | 9714249 | 4/1997 |
| WO | 9827510 | 6/1998 |

OTHER PUBLICATIONS

"Data Hiding Technology for Supporting Electronic Water Mark (Upper)", pp. 149–162, Nikkei Electronics Feb. 24, 1997 (No. 683), by Nikkei Business Pub., Inc.

(List continued on next page.)

*Primary Examiner*—Salvatore Cangialosi
(74) *Attorney, Agent, or Firm*—Antonelli, Terry, Stout & Kraus, LLP

(57) ABSTRACT

In a data transmission method for information data containing additional information data therewith, comprising, at a transmitter side, following steps:
  adding error correction codes for correcting error to said additional information data;
  embedding said additional information data added with said error correction codes into the information data by plural times, repetitively; and
  transmitting the information data embedded with the repetitive additional information data therein, and comprising, at a receiver side, following steps:
  receiving the transmitted information data embedded with the repetitive additional information data therein;
  detecting the repetitive additional information data embedded from said transmitted information data received;
  determining said additional information data on a basis of a majority rule when receiving said information data; and
  correcting error with using the error correction codes received and determined when said additional information data contains error(s) therein.

14 Claims, 10 Drawing Sheets

U.S. PATENT DOCUMENTS

| | | | |
|---|---|---|---|
| 5,606,609 A | 2/1997 | Houser et al. | |
| 5,636,292 A | 6/1997 | Rhoads | |
| 5,721,788 A | 2/1998 | Powell et al. | 382/100 |
| 5,737,417 A | 4/1998 | Buynak et al. | |
| 5,748,763 A | 5/1998 | Rhoads | |
| 5,822,425 A | 10/1998 | Ezaki et al. | |
| 5,848,155 A * | 12/1998 | Cox | 380/34 |
| 5,889,868 A * | 3/1999 | Moskowitz et al. | 380/51 |
| 5,905,819 A | 5/1999 | Daly | 382/284 |
| 5,960,081 A | 9/1999 | Vynne et al. | 380/10 |
| 5,859,920 A * | 11/1999 | Daly et al. | 382/115 |
| 6,005,643 A * | 12/1999 | Morimoto et al. | 380/201 |

OTHER PUBLICATIONS

Pixel Block Coding for Digital Still Images, by S. Shimizu, et al pp. 257–262.

Bender et al, Techniques for Data Hiding, IBM Systems Journal, vol. 35, No. 3 & 4, 1996, pp. 313–335.

K. Kido, et al "Improvement of MRI Image Quality by a Directional Adaptive Filter", Systems and Computers in Japan, vol. 28, No. 10, 1997, 99–69–76.

Bors and Pitas: "Image Watermarking using DCT Domain Constraints" Proceedings of 3rd IEEE International Conference on Image Processing, Sep. 16–19, 1996, pp. 231–234.

Nikkei Electronics Feb. 24, 1997 (683) pp. 99–107 "Digital Watermark protects multi–media age".

W. Pennebake et al, "JPEG, Still Image Data Compression Standard" JPEG, pp. 335–353.

* cited by examiner

DATA TRANSMISSION METHOD FOR EMBEDDED DATA, DATA TRANSMITTING AND REPRODUCING APPARATUSES AND INFORMATION RECORDING MEDIUM THEREFOR

CROSS-REFERENCE TO RELATED APPLICATIONS

The present application is related to application Ser. No. 09/144,467, filed Sep. 1, 1998 entitled "WATERMARK EMBEDDING METHOD AND SYSTEM" by I. Echizen et al now pending; application Ser. No. 09/144,989, filed Sep. 1, 1998 entitled "METHOD AND SYSTEM FOR EMBEDDING INFORMATION INTO CONTENTS" by H. Yoshiura et al now pending; and application Ser. No. 09/148,325, filed Sep. 4, 1998 entitled "RECORDING/REPRODUCING METHOD AND APPARATUS PROCESSING APPARATUS AND RECORDING MEDIUM FOR VIDEO SIGNAL HAVING COPY CONTROL INFORMATION" by H. Kimura et al now pending.

BACKGROUND OF THE INVENTION

1. Field of the Invention

The present invention relates to a data transmission method for transmitting and receiving data, such as video and/or audio data in which additional information data (i.e., data hiding or water mark, etc.) are embedded or concealed, and apparatuses for transmitting and reproducing such the video and/or audio data, and in particular, relates to data transmitting and reproducing apparatuses for embedding and detecting the additional information data which are embedded or concealed into the data being transmitted, as well as an information recording medium therefor.

2. Description of Prior Art

Up to now, data hiding has been studied or researched as a technology for embedding or concealing an identification information and/or an annotation into original contents in a form of, such as text data and/or audio/video data. In recent years, the data hiding technology begins to be applied as a technology for protecting a copy right from illegal operations, such as copying of the original data, by embedding such the identification information into them. Such the technology is described in "Data Hiding Technology for Supporting Electronic Water Mark (Upper)", pages 149 through 162, NIKKEI ELECTRONICS 1997.2.24 (no.683), by Nikkei Business Publications, Inc.

The data being embedded into the original data, however, are deteriorated through various operations including, such as a filtering, a data compression and so on, thereby, they sometimes happen to be removed from them, for instance, in particular, after encoding/decoding (or converting/inverting) operation thereof. Therefore, such the hidden data are inserted or embedded in the original data or the like repetitively, so as not to be deleted therefrom easily.

However, in the prior art mentioned in the above, there is no description or teaching about a concrete and/or practical way of reproducing the additional information data which are embedded into the original data repetitively, with a low error rate.

Since the video or picture data is large in an amount thereof, therefore, normally it is transferred after being compressed. The transferred data is then de-compressed to be restored into the original data, however, it is impossible to restore them back to the original ones perfectly or completely, due to the processes of such the compression/de-compression. Further, when transmitting the data, errors may occur in the data depending on the route of the data transmission. For restoring such the erred data, it is ordinary to add an error correction code onto it previously, and then so-called correction of the erred data can be performed therewith. However, in the restoration of the data with such the error correction code, though it is possible to detect the error(s) occurring in the data, it is sometimes impossible to restore or correct them if the reliability of the data itself cannot be ensured at a level higher than a certain level. Therefore, it is necessary that an error rate of the data being transmitted must be reduced as low as the error correction is possible to be applied in the level or degree thereof.

SUMMARY OF THE INVENTION

An object of the present invention is, therefore, for dissolving the problems in the above-mentioned conventional art, to provide a transmission method of such the data into which additional information data, including identification information data, control data and so on (hereinafter, comprehensively described by "identification information data"), and a data transmitting apparatus and a data reproducing apparatus, as well as an information recording medium therefor.

For achieving the above-mentioned object, in accordance with the present invention, first of all, there is provided a data transmission method for information data containing additional information data therewith, comprising, at a transmitter side, following steps:

a fist step for adding error correction codes for correcting error to said additional information data;

a second step for embedding said additional information data added with said error correction codes into the information data by plural times, repetitively; and a third step for transmitting the information data embedded with the repetitive additional information data therein.

Also, for achieving the above-mentioned object, in accordance with the present invention, there is provided a data transmission method for the information data transmitted through the method as defined in the above, comprising, at a receiver side, following steps:

a fourth step for receiving the transmitted information data embedded with the repetitive additional information data therein;

a fifth step for detecting the repetitive additional information data embedded from said transmitted information data received in the fourth step;

a sixth step for determining said additional information data on a basis of a majority rule when receiving said information data; and a seventh step for correcting error with using the error correction codes received and determined when said additional information data contains error(s) therein.

Further, for achieving the above-mentioned object, in accordance with the present invention, there is provided a data transmission method for information data containing additional information data therewith, comprising, at a transmitter side, following steps:

a fist step for encoding said additional information data in accordance with a predetermined conversion table;

a second step for embedding said additional information data encoded in the above step into the information data by plural times, repetitively; and a third step for transmitting the information data embedded with the repetitive additional encoded data therein.

Also, for achieving the above-mentioned object, in accordance with the present invention, there is provided a data transmission method for the information data transmitted through the method as defined in the above, comprising, at a receiver side, following steps:

a fourth step for receiving the transmitted information data embedded with the repetitive additional information data encoded;

a fifth step for detecting the repetitive additional information data encoded, which are embedded within the information data received;

a sixth step for determining said encoded additional information data on a basis of a majority rule of the repetitive encoded additional information data detected; and a seventh step for decoding the encoded data into the additional information data.

Further, for achieving the above-mentioned object, in accordance with the present invention, there is provided a data transmission method for transmitting information data containing additional information data therewith, comprising following steps at a transmitter side:

a step for preparing data frames of said information data into which the additional information data are to be embedded;

a step for altering at least part of the data frame in accordance with predetermined patterns corresponding to the additional information data to be embedded, for the plural continuous frames, repetitively; and a step for transmitting the information data embedded with the repetitive additional information data therein.

And, also, for achieving the above-mentioned object, in accordance with the present invention, there is provided a data transmission method for the information data transmitted through the method as defined in the above, comprising, at a receiver side, following steps:

a step for receiving the transmitted information data embedded with the repetitive additional information data therein;

a step for detecting the repetitive additional information data embedded from said transmitted information data; and a step for determining said additional information data on a basis of continuity of the repetitive additional information data detected for a predetermined times.

And also, for achieving the above-mentioned object, in accordance with the present invention, there is further provided a data transmitting apparatus for transmitting information data containing additional information data therewith, comprising:

a first means for adding error correction codes for correcting error to said additional information data;

a second means for embedding the additional information data added with the error correction codes by said first means into the information data by plural times, repetitively; and a third means for transmitting the information data embedded with the repetitive additional information data therein.

Also, for achieving the above-mentioned object, in accordance with the present invention, there is provided a data reproducing apparatus for reproducing the transmitted information data transmitted by the data transmitting apparatus defined in the above, comprising:

a first means for receiving the transmitted information data embedded with the repetitive additional information data therein;

a second means for detecting the additional information data embedded from the transmitted information data received by said first means;

a third means for determining said additional information data on a basis of a majority rule when receiving said information data; and a fourth means for correcting error with using the error correction codes received and determined when said additional information data contains error(s) therein.

And also, for achieving the above-mentioned object, in accordance with the present invention, there is provided a data transmission apparatus for transmitting information data containing additional information data therewith, comprising:

a fist means for encoding said additional information data in accordance with a predetermined conversion table;

a second means for embedding said additional information data encoded in the first means into the information data by plural times, repetitively; and a third means for transmitting the information data embedded with the repetitive additional encoded data therein.

Also, in accordance with the present invention, there is provided a data reproducing apparatus for reproducing the transmitted information data transmitted by the data transmitting apparatus defined in the above, comprising:

a first means for receiving the transmitted information data embedded with the repetitive additional information data encoded;

a second means for detecting the repetitive additional information data encoded which are embedded within the information data received;

a third means for determining said encoded additional information data on a basis of a majority rule of the repetitive encoded additional information data detected; and a fourth means for decoding the encoded data into the additional information data.

And further, according to the present invention, there is provided a data transmission apparatus for transmitting information data containing additional information data therewith, comprising:

a first means for preparing data frames of said information data into which the additional information data are embedded;

a second means for altering at least part of the data frame in accordance with predetermined patterns corresponding to additional information data to be embedded, for the plural continuous frames, repetitively; and a third means for transmitting the information data embedded with the repetitive additional information data therein.

Further, according to the present invention, there is provided a data reproducing apparatus for reproducing the transmitted information data transmitted by the data transmitting apparatus defined in the above, comprising:

a first means for receiving the transmitted information data embedded with the repetitive additional information data therein;

a second means for detecting the repetitive additional information data embedded from said transmitted information data; and a third means for determining said additional information data on a basis of continuity of the repetitive additional data detected for a predetermined times.

Moreover, also for achieving the above mentioned object, in accordance with the present invention, there is also provided an information recording medium for recording data therein, comprising:

information data being reproducible;

additional information data which are embedded into said information data repetitively; and error correction codes which are added to said additional information data and also embedded into said information data repetitively.

DETAILED DESCRIPTION OF PREFERRED EMBODIMENTS

Hereinafter, various embodiments and variations of a data transmission method and an apparatus for transmitting and reproducing original data, such as the video and/or audio data, according to the present invention, will be fully explained by referring to the attached drawings.

Figure 1:
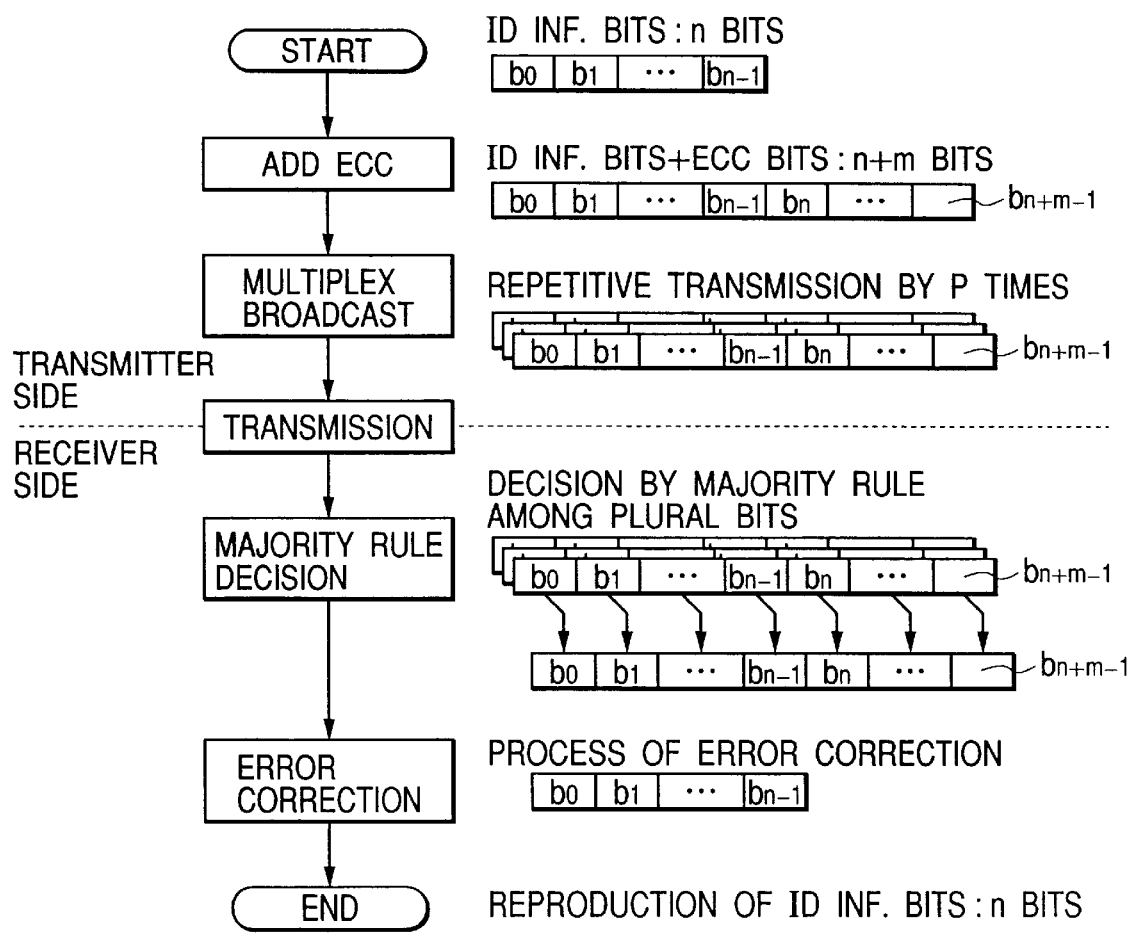
FIG. 1 shows an embodiment of a flow of processes of coding/decoding for the data transmission, in accordance with the present invention.

FIG. 1 shows an embodiment of a flow of processes of coding/decoding for the data transmission, in accordance with the present invention.

In FIG. 1, there are shown an identification information bits or identification bits, i.e., of n bits (b0, b1, b2, ... bn-1), and error correction codes, being added for executing the error correction upon the identification information bits when the error(s) occurs/occur therein, i.e., of m bits (bn, bn+1, bn+2 ... bn+m-1), including such the data hiding and/or water mark or the like therein, thereby forming an additional information data, i.e., of n+m bits (b0, b1, b2 .. . bn, bn+1, ... bn+m-1) to be embedded into an original data, including such as text data or audio/video data. In order to reduce influences upon the additional data due to a transmission system, the same data are embedded repetitively, i.e., by a plurality of times (for instance, P times) into the original data to be transmitted.

Here, as one way of repetition for each of the information bits of the additional information data is, each bit is embedded and transferred by P times, respectively, as is shown below:

| b0, b0, b0 ... b0 | P times |
|---|---|
| b1, b1, b1 ... b1 | P times |
| ... | ... |
| ... | ... |
| ... | ... |
| bn+m−1, bn+m−1, bn+m−1 ... bn+m−1 | P times | or, alternatively, by forming an unit of data of m+n bits with the additional data to be embedded and transferred, as is shown below:

(b0, b1, b2 ... bn+m−1), (b0, b1, b2 ... bn+m−1), ...
    P times

However, other ways than the mentioned in the above can also be applied thereto. The details in a method for embedding of the additional information data will be given later.

Heretofore is the explanation on processes or operations at a data transmission side. Namely, the additional information data, including such the identification bits and the error correction code, are embedded or concealed into the transmission data to be transferred, repetitively, and is transferred through the transmission system to a receiver side of the data. At the receiver side, a decision is made on the basis of so-called a majority rule with respect to the additional information data which are transferred repetitively. For instance, when the data bit b0 is transferred by P times, the value of the bit is decided to be that of the majority among b0s of number P, for instance, b0=1 or 0. In the same manner, by collecting data of the P pieces for each of the bits (b0, b1, b2 ... bn+m−1) and determining the value for each bit by the majority rule, the additional information data (of n+m bits) can be obtained. Thereafter, error(s) occurring among the identification information bits is/are detected and corrected by means of the error correction codes of m bits, thereby obtaining the identification information bits of n bits correctly.

By transferring the additional information data with use of such the method, it is possible to practice the error correction by means of the error correction code while reducing the error rate in the additional information data which are embedded and transferred.

Figure 2:
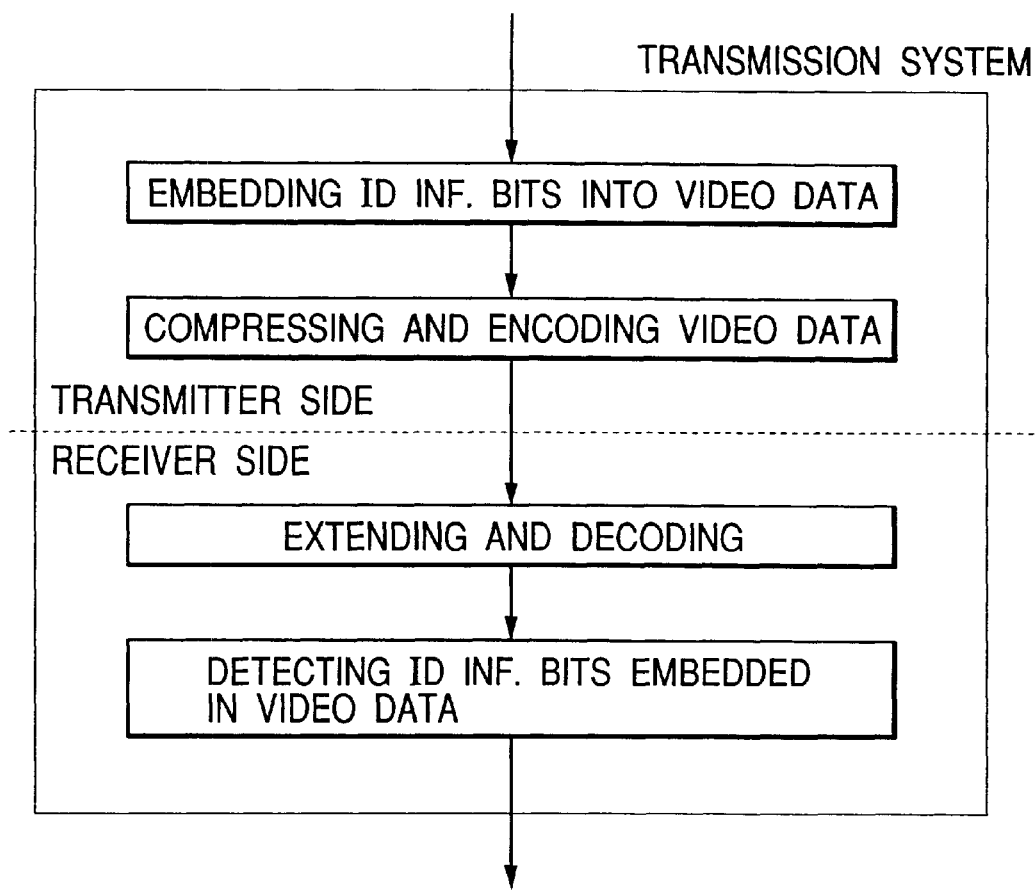
FIG. 2 shows in more details of the processes of the transmission of the additional information data as shown in FIG. 1.

FIG. 2 shows in more details of the processes of the transmission of the additional information data as shown in FIG. 1. In this example shows here, the additional information data are embedded or concealed within the video data so as to be transferred. However, the original data into which the additional information data are to be embedded should not be restricted only to such the specific one, such as the video and/or audio data or the like.

In the same figure, the additional information data are prepared for the repetitive transmissions of P times with adding the error correction codes to the identification information data, and those are embedded or concealed into the video data. Here, however, points or positions where the each additional information data is embedded are determined in advance, or the information of those points are also possible to be already transferred to the receiver side by an another means in advance. The data of image located corresponding to those points where the each additional information data are embedded are converted or altered in each value of the bits thereof, according to the values of the information, though details of the conversion of the bits will be given later.

Those embedded additional information data are compressed in the manner which is same to that of the data of the other data, i.e., the data of pixel blocks of the video data, and are encoded if necessary. The data which are processed in this manner are transferred by recording them onto a package medium of such as a CD or a DVD, or are transferred directly through radio waves, in such a case of broadcasting.

Next, the package medium is received and/or reproduced (playback) by means of a reproducing apparatus as a means for receiving, or the radio wave is received by a receiver in the case of the broadcasting. And, then the data are processed with decoding process in accordance with the encoding method mentioned above. After that, the data which are compressed are extracted or extended. Here, the embedded additional information data are detected from the pixel data of the pixel blocks of the video data by means of a detector for detecting the additional information data which are embedded into the video data. The embedded additional information data which can be obtained in this manner are detected from the positions of the number P, i.e., the P pixel blocks within the video data, for each of the bits of the additional information data, and the decision by the majority rule is applied with respect to the each bit. Namely, this process is applied to the n+m bits so as to obtain the additional information data, and the correction of the errors is performed by means of the correction codes also contained in the additional information data, thereby, obtaining the correct values of the information bits of the additional information data without errors.

With using such the method, it is possible to transfer the additional information bits embedded or concealed into the original data, as well as to obtain the information bits thereof with a low error rate, thereby, it is possible to transfer such the addition information with a high reliability.

Figure 3:
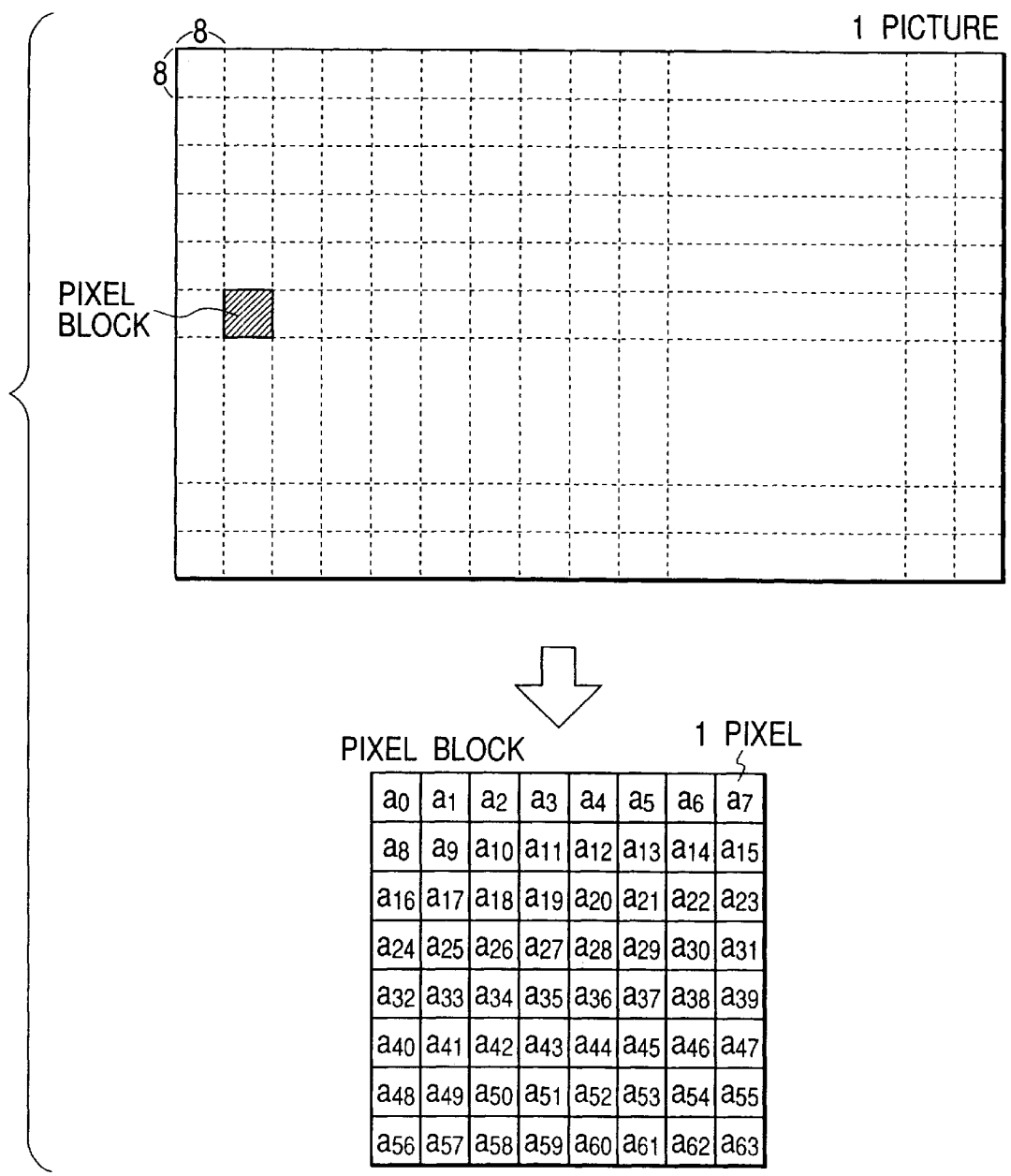
FIG. 3 shows an embodiment of a process for embedding the additional information into the video data.

FIG. 3 shows an embodiment of a process for embedding the additional information into the video data. A piece of a picture (i.e., the video data) can be replaced with a set of data, and in order to perform the embedding process to the data, first of all, they are divided into the plurality of pixel blocks of a squire shape in the number 8×8=64, for example. Here, each pixel of them is formed with the data of a predetermined number of bits, for instance, if it is formed with the data of 8 bits, it is for a resolution power of 256 steps. And, such the data of the number of sixty-four (64) gathering together construct each of the pixel blocks.

Here, in case that a certain pixel block is coincident with the point where the additional information data is to be embedded, a process is applied to the pixel block depending on the values, i.e., 1 or 0 of respective bits of the additional information data. For example, when one of the bits of the additional information data which is to be embedded into that point is "1", then the values of the data of the 64 pixels are converted or altered in such a manner that the total value of the 64 pixel data comes to be a multiple of 256:

($a0+a1+a2+ \ldots a63$) mod 256=0

("mod" indicates a residuum of division) on the other hand, when it is "0", the values of the data a0 through a63 are converted or altered in such a manner that the total value of the 64 pixel data comes to be a multiple of 256 plus the residuum 128, i.e.:

($a0+a1+a2+ \ldots a63$) mod 256=128

Here, according to the present invention, the value of the 256 (and also 0, and 128) should not be restricted only to that value, however, if it is selected to be a larger one, though it is easy to make the decision as well as to reduce the number of errors, while the original data of the 64 pixels are changed by large amounts of values thereof.

The values of the 64 pixel data in the one pixel block are converted or altered in this method, thereby the additional information data are embedded into the video data one by one, separately.

Those additional information data, however, sometimes happen to be reproduced incorrectly, i.e., with error through the transmission system, in particular when they are compressed/decompressed after being embedded. Therefore, taking such the case into the consideration, the condition for deciding the value of the each bit of the additional information data after being received should not be restricted only to that defined in the above, i.e., ($a0+a1+a2+ \ldots a63$) mod 256=0 however, it is preferable to be selected to 0±α (α is an arbitrary value being equal or less than 64 (α≦64) which is determined by the compression method, etc.).

Here is described the example in which the additional information data are embedded into the values of the pixel block of the picture of, such as the video data, however, it is also possible to embed or conceal the additional information data into a transmission data, such as values of bit-stream which are obtained through a frequency conversion, such as DCT (discrete cosine transfer) or FFT (fast Fourier transform).

Figure 4:
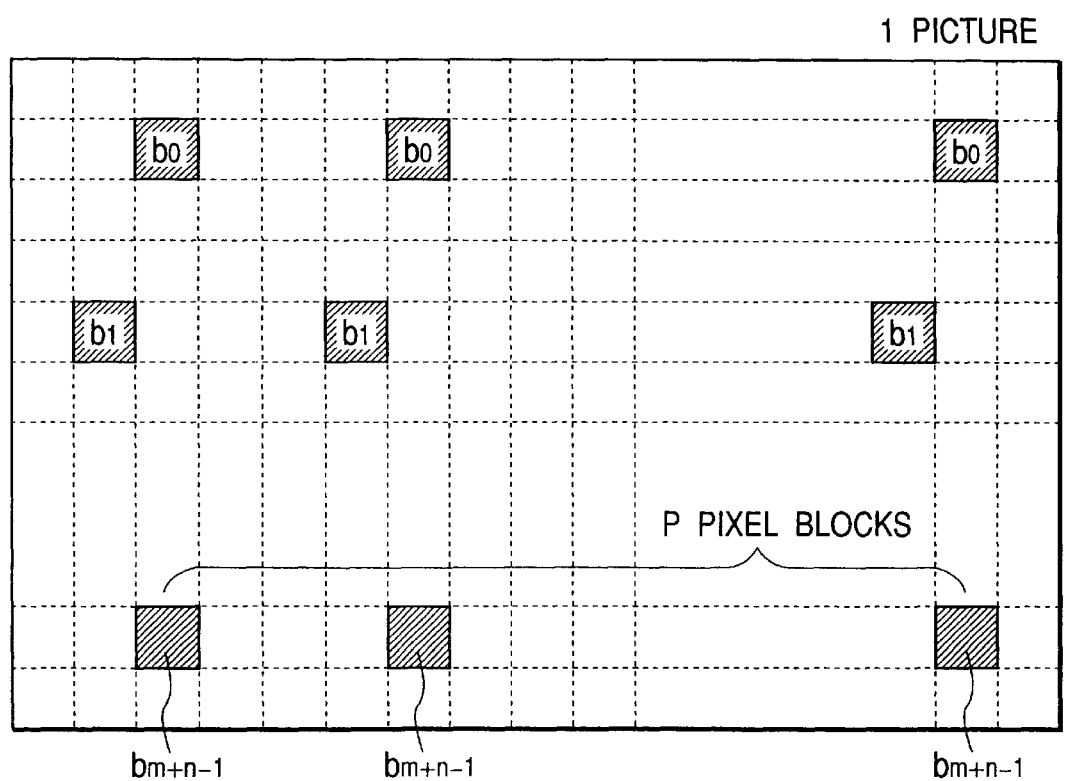
FIG. 4 shows an example of the points or positions, at which the additional information data are embedded, within one piece of the picture as a whole.

FIG. 4 shows an example of the points or positions, at which the additional information data are embedded, within one piece of the picture (an unit of the video data) as a whole. At the plurality of points of number (n+m)×P in the picture data, the additional information data are embedded or concealed, separately and repetitively.

When receiving, the P bits of b0 are gathered from the points where the b0 bits are embedded so as to make the decision on the value of the b0 bit by the majority rule. This is effected with respect to the n+m bits, thereby obtaining the additional information data after the majority rule decision. In this manner, by embedding each bit of the additional information data into the plurality of points repetitively, it is possible to make the majority rule decision when receiving, thereby enabling reproduction of the additional information bits correctly.

Figure 5:
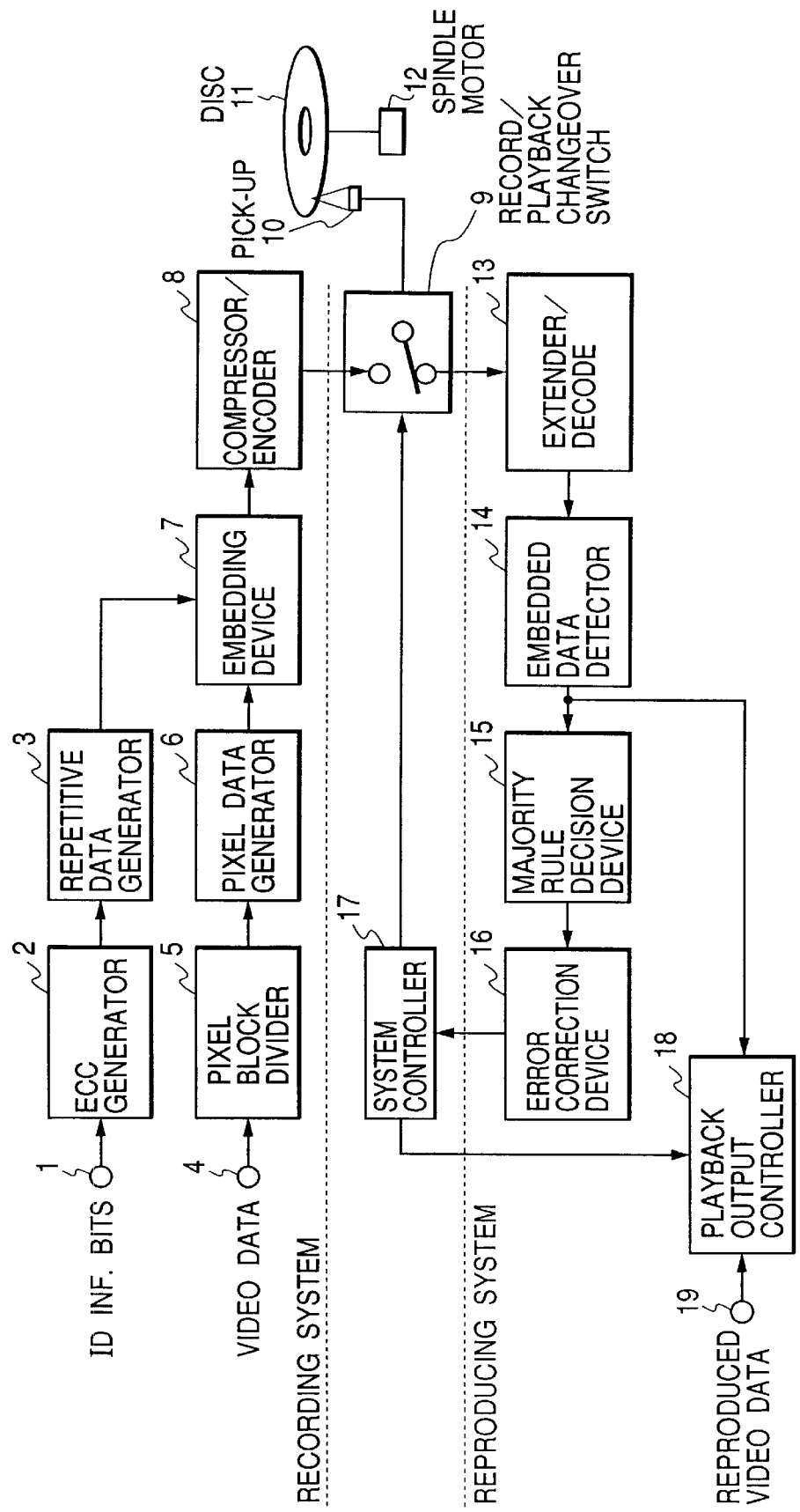
FIG. 5 an embodiment of a signal processing apparatus of performing the process of coding/decoding, for the data transmission according to the present invention.

FIG. 5 shows an embodiment of a signal processing apparatus of performing the process of coding/decoding, for the data transmission according to the present invention. In this embodiment, there is shown a case where the additional information of several ten bits are embedded or concealed into the video data and are recorded and/or reproduced into/from a disc, such as the DVD.

Here, a reference numeral 1 indicates an input terminal of the identification information bits, 2 an error correction code generator, 3 a repetitive data generator, 4 an input terminal of the video data, 5 a pixel block divider, 6 a pixel data generator, 7 an embedding device of the additional information data, 8 a compressor/encoder, a 19 a record/playback changeover switch, 10 a pick-up, 11 a disc, 12 a spindle motor, 13 an extender/decoder, 14 an embedded data detector for detecting the data being embedded into the data, such as the video data, 15 a majority rule decision device, 16 an error correction device, 17 a system controller, 18 a playback output controller, and 19 an output terminal of the reproduced video data, respectively.

In the same figure, the identification information data which is provided at the input terminal 1 includes, for example, a copy control information which is necessary for playback. Namely, playback control, i.e., inhibit of playback and/or inhibit of outputting the reproduced signal, is conducted in accordance with this information. The error correction code generator 2 generates and adds so-called parities to the identification information data at the input terminal 1 as the error correction codes, and the repetitive data generator 3 makes copies of the data being formed by adding the error correction codes to the identification information, for the number of times (i.e., P times) of being transmitted repetitively. The video data at the input terminal 4 is an original data of such as the video data, and are coded with a predetermined format so as to be transferred. The pixel block divider 5 divides the original video data into the plurality of pixel blocks being made of the 8×8 pixel data so as to be embedded with the additional information data therein. The embedding device 7 performs a process for embedding the additional information data, to which the error correction codes are added, into the divided pixel blocks of video data. This is done by embedding one (1) bit of the additional information data at the predetermined points or positions one by one, repetitively.

The data formed in this manner are compressed by the compressor/encoder 8 and then encoded in accordance with a predetermined recording format. With this, the data being fitted for the recording format are produced and are written by the pickup 10 on a recording layer on the disc 11.

The spindle motor 12 is an electric motor which ratably drives the disc 11 therewith.

When performing playback (reproducing), the record/playback change-over switch 9 is turned to the playback side, and the reproduced data are sent from the pickup 10 which reads out the signals recorded on the disc 11 to the extender/decoder 13. With this extender/decoder 13, a decoding process in accordance with the coding method is performed on the reproduced data, and then the data are extended. From the data, in particular, from the pixel blocks in which the additional information data are embedded, the additional information data of the number of repetition (i.e., P times) are detected with the embedded data detector 14. The majority rule decision device 15 makes decisions on the value of each bit of additional information data which are detected at the number of the repetition number (i.e., P times), and the additional information data are constructed with the data which are decided by the majority rule. The error correction device 16 detects the error(s) in the information bits of the identification data and corrects it/them, with use of the correction codes which are contained in the embedded additional information data. The information bits which are reproduced in this manner has a low possibility of error. And, if the reproduced information bits construct the identification data including the copy control, such as the information of inhibiting or protecting from the copy thereof, then the system controller 17 controls the playback output controller 18 in such a manner that it stops outputting of the reproduced video data at the output terminal 19.

Here, it is assumed that the each additional information data is constructed with the total 46 bits data, i.e., with the identification data of 32 bits, which are provided at the input terminal 1, the error correction code of 6 bits, and 8 bits data indicting a head of the data. If 2,000 points or positions are set as those for embedding the additional information data therein, within one piece of the pictures, then the additional information data can be transferred by 43 times, repeatedly. Here, if the error rate in the transmission system is 0.1, then the probability that the error can be contained in the information bits comes to be $1 \times 10E^{-10}$ after being conducted with the majority rule decisions thereon in the playback operation. If the error rate in the transmission system is 0.2, then it comes to be about $5 \times 10E^{-6}$. With such the error rate, in case where the error correction is executed with use of the error correction codes of 6 bits, the error rate comes down to $1 \times 10E^{-9} \sim 1 \times 10E^{-10}$, therefore it is possible to suppress an input error rate down to low.

Figure 6:
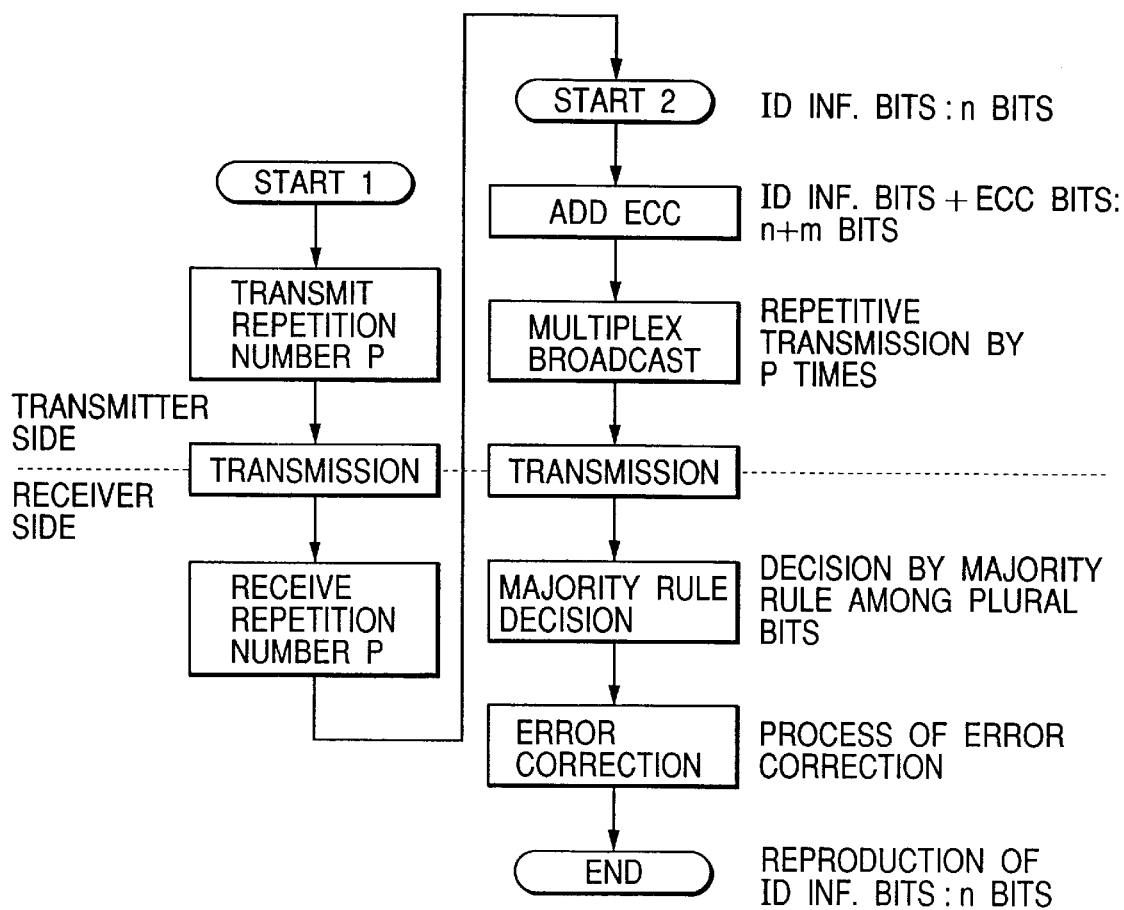
FIG. 6 shows an another variation of the flow of processes of coding/decoding for the data transfer, according to the present invention.

FIG. 6 shows an another variation of the flow of processes of coding/decoding for the data transfer, according to the present invention. Here, the reference numerals same to those in FIG. 1 indicate the same elements thereof.

In FIG. 6, as in the same manner as shown in FIG. 1, the identification information data of n bits to be transferred are encoded or converted into the additional information data of n+m bits by using a conversion table which is provided for encoding of the identification data in accordance with a predetermined rule. The same additional information data encoded are also transferred repetitively at the plurality of times (P times) for lessening the influence upon occurrence of the change or error in the additional information data due to the condition of the transmission system. Here, by transferring the number of repetition P in advance with use of a separate means, it is possible to set the repetition number corresponding to the condition of the transmission system suitably, even in a case where there are plural kinds of transmission systems, in which the they are different from one other in the most suitable number for the repetition. In the case where the transmission system is the disc, for example, the repetition number is determined from the data compression/extension rate in the playback operation as well as the error rate of the disc, and the value of it is stored or recorded in a specific portion of the disc, i.e., a TOC (Table of Contents) area, for example. And, when reproducing, the repetition number is reproduced first of all. With use of such the method, it is possible to transfer the additional information data with the repetition number being suitable for the transmission system.

For instance, in a case where the data compression, such as MPEG or the like, is applied to the video data for the transmission thereof, since there is provided a header for each unit, i.e., a picture of the screen in the data format of the MPEG, it is possible to insert the repetition number P into a portion of the header as an additional information thereto. Further, it is also possible to insert the repetition number P for each of an unit of GOP (Group of Picture), which is a data unit in the MPEG format. In those cases, the repetition number P can be transferred by the unit of the picture or the GOP, thereby enabling the repetition which is most suitable for the video data.

Here, if the value of the repetition number P can be deciphered, there is a possibility that it is changed or altered in the value thereof. For keeping a secrecy thereof, it is preferable that the repetition number P is stored or written in code, thereby making it difficult to be deciphered, and strengthening an algorithm of it.

Transferring the information data with use of such the method mentioned above, it is possible to set the repetition number P suitably corresponding to the condition of the transmission system, even in a case where there are plural kinds of transmission systems in which the they are different from one other in the most suitable number for the repetition. Thereby, it is possible to execute the majority rule decision on the additional information data so as to reduce down the error rate thereof, and to enable the error correction with use of the error correction codes. Further, with the method being same to this, it is also possible to transfer the information relating to the positions or points in which the additional information data are embedded and/or the threshold value (such as the a $\alpha=256$ mentioned in the above) for executing the majority rule decision. Moreover, though the explanation was given on the majority rule decision which is used for deciding the value of each bit of the additional information data from the P number of embedded data in the embodiments mentioned in the above, however, the present invention should not be restricted only to such the rule. Namely, in place of the majority rule decision, a way of decision of using a threshold value is also applicable, i.e., if the same value (1 or 0) is detected by a plurality of times which is greater than the threshold value thereof, for each one bit of the additional information data, then the detected value is decided to be the value of that bit.

Figure 7:
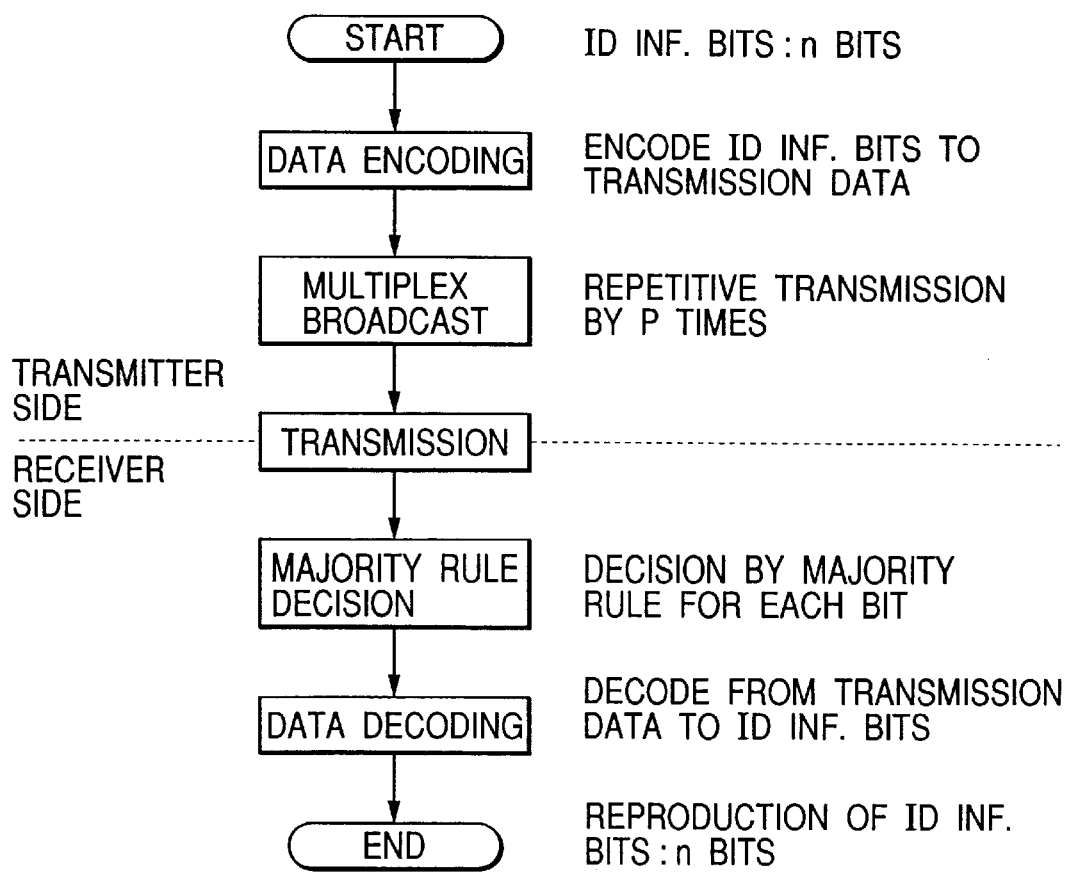
FIG. 7 shows further other variation of the flow of processes of coding/decoding for the data transfer, according to the present invention.

FIG. 7 also shows a further other variation of the flow of processes of encoding/decoding for the data transfer, according to the present invention. Here, the reference numerals same to those in FIG. 1 indicate the same elements thereof.

In FIG. 7, also in the same manner as shown in FIG. 1, the identification information data of n bits to be transferred are encoded into the additional information data of n+m bits by a conversion table which is provided for converting the identification information data in accordance with a predetermined rule. In this time, it is preferable to encode or alter the data into those which are not easily confused with the other data. The additional information data encoded are also transferred repetitively at a plurality of times (P times) for lessening the influence upon occurrence of the change or error in the additional information data due to the condition of the transmission system. Heretofore is the description about the transmitter side. The additional information data are transmitted repeatedly are transferred to the receiving side. At the receiver side, with respect to the additional information data which are transmitted repeatedly, the decisions are made by the majority rule by the number of repetitions, i.e., P times. Namely, if the data is the digital data, the value which are detected by times more than P/2 is decided to be the value of the data. This majority rule decision is made by P times with respect to each bit of the data of n+m bits, thereby obtaining the additional information data of n+m bits. After that, the additional information data is decoded through a decoder table which is contrary to that of the encoder used when encoding the data, thereby obtaining the original identification information data of the n bits.

Transferring the information data with use of such the method mentioned above, it is possible to execute the majority rule decision upon the additional information data so as to reduce down the error rate thereof, and to enable the error correction with use of the error correction codes, even in case where the error rate of the data is high depending on the transmission system, therefore is impossible the error correction with use of the error correction codes.

Figure 8:
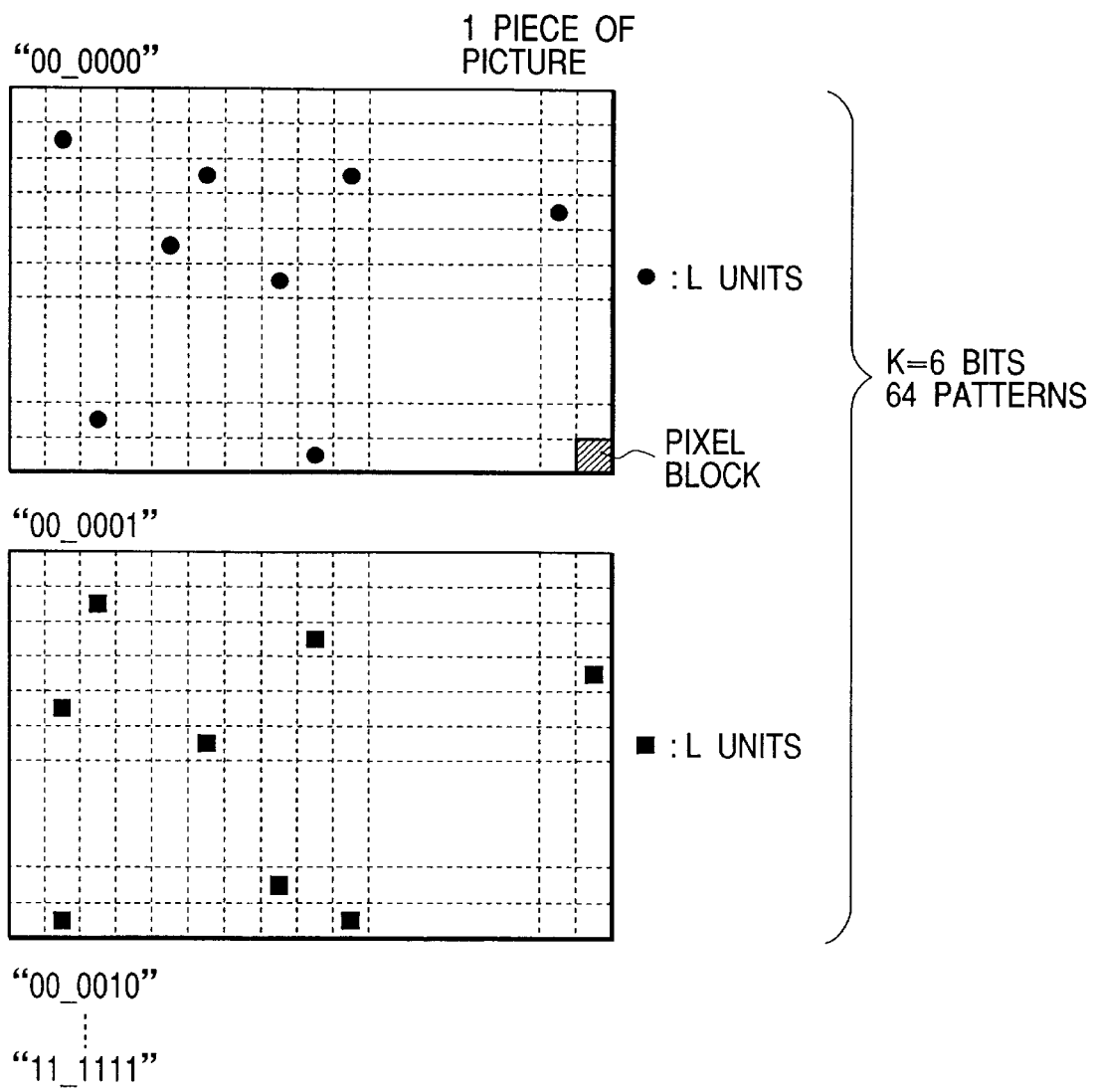
FIG. 8 shows an another embodiment of the flow of processes of coding/decoding for the data transfer, according to the present invention.

Further, FIG. 8 shows an another embodiment of the flow of processes of coding/decoding for the data transfer, according to the present invention.

In FIG. 8, each of the additional information data is also embedded into the units of the pixel block, in the same manner as is disclosed in FIG. 3 above. In this embodiment, it is assumed that the number of the bits of the identification information data to be transferred is constructed with K bits (for example, K=6, therefore, $2^6=64$ patterns), and that the number of the pixel blocks into which the information bits of the identification information data are embedded is L within each one piece of the pictures. In this embodiment, for instance, if the bits of the identification information data are "00_0000", the total value (=0) of the bits of the identification information data is embedded into every L pieces of the pixel blocks of the one piece of the picture, which are indicated by "●" in the figure, and if the bits of the identification information data are "00_0001", the total value (=1) of the of the identification information data is embedded into the every L pieces of the pixel blocks of the one piece of the picture, which are indicated by "■" in the figure. In this manner, the identification information data are embedded into the each picture, corresponding to the 64 kinds of patterns in case that it is of six (6) bits data, in such a manner that the position of the every pixel block never overlapped among all of the 64 kinds of patterns of the pictures into which the identification information data are embedded. Here, at least K×L (64×60=3840) pixel blocks are necessary to be contained in one piece of the picture. This is because, if the number is less than that, the embedding patterns overlap to each other, therefore, the probability of detecting the embedded identification information data incorrectly with error(s) is increased, when deciding the corresponding bits of them.

Embedding the identification information data in this manner, while it is possible to decide if the identification data is embedded or not, upon the presence of data corresponding to the specific embedded patterns in the information data of the reproduced data at the receiver side. And, also it is possible to decide the identification information data upon a fact that which embedded pattern it is coincide with or near to. In case that the identification information data are transferred in this method, there can be happen a case where the embedded position(s) is/are detected at the position(s) other than those of the embedded pattern mentioned above, however, by searching or checking it over the patterns at the positions of the number L, since only one pattern comes to be approximated to, thereby it is possible to decide the identification information uniquely.

Further, as the embedded patterns can be used those which are predetermined previously, however, it is also possible to code the information relating to the embedded pattern corresponding to each identification information bit so as to transfer them as data in advance, thereby using the embedded patterns corresponding to the respective conditions of the transmission systems of the data, appropriately.

Figure 9:
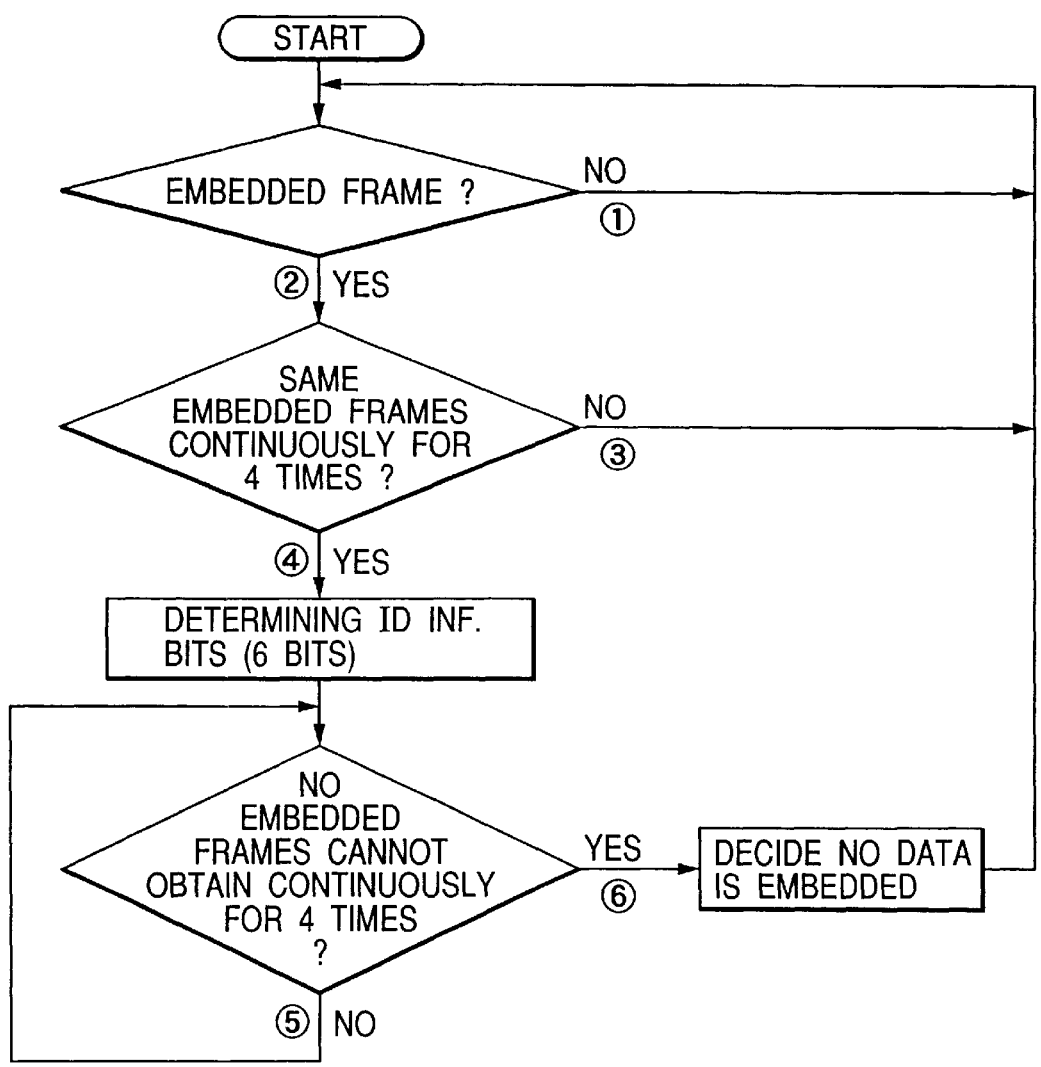
FIG. 9 shows an example of a method of deciding the identification data when receiving them which are embedded in accordance with the manner shown in FIG. 8.

FIG. 9 shows an example of a method of deciding the identification information data when receiving them which are embedded in accordance with the manner shown in FIG. 8. Further, FIG. 10 shows an example of changes in the condition of the decisions on the identification information data at that time.

In FIG. 9, first of all, it is decided whether the identification information data are embedded or not, upon the presence of the data which is near to one of the patters of the identification information data in the received data, and it is decided by a fact which one of the embedded patterns it is coincide with. Here, when embedding the identification information data, the value to be altered or converted is determined within a certain range of a value, for example, when the total value of the values of the pixel data of the pattern of the identification information bit is changed within a range 512±64 (for instance, in case of data of 9 bits), the embedding of the data can be detected at a probability of one fourth (¼) of a value in a case where the identification information data are embedded, even when no identification information data are embedded. Therefore, which one of the embedded patterns the data comes to be coincident with can be decided, though they are not completely coincident with due to the error(s) of the transmission system, by selecting one among of them, in particular, which shows more points coincident with those of the pattern than the others.

Here, assuming that one piece of the picture is to be the data of one frame, the data of the embedded pattern corresponding to the identification information bits are converted into the data of the one frame to be transferred. At this time, if the probability of the error detection in the identification information bits is high as the result of transmission thereof, it is possible to increase up the reliability by detecting and deciding the identification information bits in a sequence. For example, it is conditioned that the identification information bits can be detected by detecting them for 4 frames in sequence, continuously, and that the detection is started again if a frame which does not coincide with is detected on the way of detection therefore the identification information bits cannot be detected for 4 frames continuously. And as the result of this, when the same identification bits are detected continuously, the identification bits can be decided.

Figure 10:
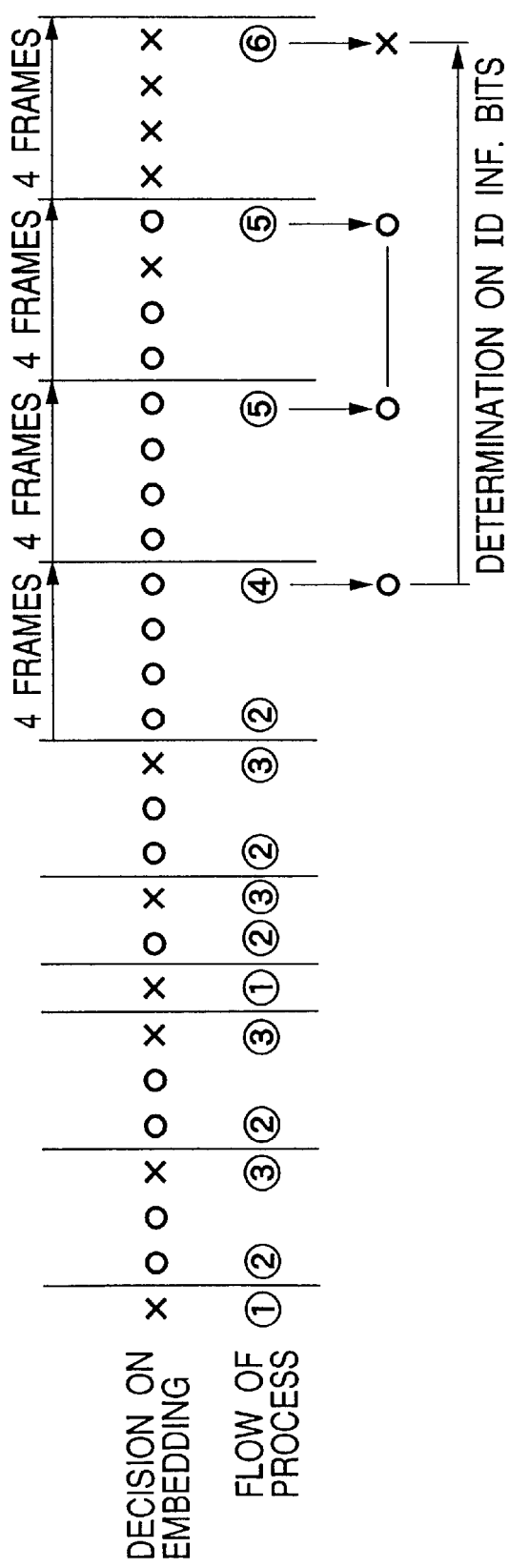
FIG. 10 shows an example of changes in the condition in the decisions on the identification information data at that time.

Reference marks ① through ⑥ in FIG. 10 correspond to branches of the flow shown in FIG. 9. When detecting the frames in which the identification information data are embedded, it comes to the branch ②, while it comes to the branch ③ when no such the frame in which the identification information data are embedded can be detected. And, when four (4) of such the frames can be detected continuously, it comes to the branch ④, while it comes to the branch ③ when no such the continuous frames cannot be found, thereby determining the information bits thereof.

Next, in FIG. 9, after determining the identification information bits once, they will not be invalidated soon, even if occurring such the frame that it is not coincide with the embedding pattern therefore the identification information bits cannot be determined therefrom. For instance, the identification information bits being determined once are canceled only when the same identification information bits can be detected continuously for the four (4) frames in sequence, thereby trying the determination again. In this way, by protecting the identification information bits being determined once, it is possible to maintain them dealing with omission of data due to deterioration of the error rate in the transmission system.

In FIG. 10, when no frames cannot be found continuously four (4) times, the flow comes to the branch ⑥, however, if not so, it comes to the branch ⑤ so as to maintain the identification information bits as before.

With use of such the method, it is possible to prevent from the erroneous detection of the identification information bits, and also to obtain the protection of them after the detection thereof.

As is fully described in the above, according to the present invention, when transmitting the video and/or audio data added with the additional information bits of such as the copy protection, the error correction codes are added to the additional information bits so as to correct them if error occurs therein, thereby preparing the additional information data to be transmitted. And, for lessening the influence upon the additional information data due to the change or error of the data in the transmission system, the same additional information data are embedded into the original video data repetitively, by plural times (i.e., P times).

When receiving, with respect to the additional information data which are embedded repetitively, the determination by the majority rule is executed thereon. Assuming that the additional information data are repeated by P times, a value of the majority (more than P/2) among the received data of number P is decided to be the value. The determination by the majority rule is executed by gathering the data of the number P for all of the bits, thereby obtaining the additional information data. After that, the errors of the additional information bits are detected and/or corrected by use of the error correction codes, thereby obtaining the identification information bits contained therein, correctly.

By transmitting the information data with use of such the method, the error rate of the additional information data can be reduced through the determination by the majority rule, and correction of error can be performed by use of the error correction codes, even in the case where the error correction cannot be executed because of high error rate of the data due to the transmission system, thereby achieving the transmission of such the additional information data with high reliability.

Further, by determining the embedding patterns corresponding the additional information bits and embedding them with converting or changing the data values of the pixel blocks thereof, while determining the additional information bits on the basis of continuous detection of the embedding patters when receiving, and resetting the additional information bits (i.e., deciding that no additional information bits are embedded) when occurring such the condition that no embedded pattern cannot detected continuously, after once making the determination thereof, thereby the determination and the protection of the additional information bits can be achieved.

What is claimed is:

1. A data transmission method for information data containing addition information data therewith, comprising, at a transmitter side, the following steps:

a first step for adding error correction codes for correcting error to said additional information data;

a second step for embedding said additional information data added with said error correction codes into the information data by plural times, repetitively; and a third step for transmitting the information data embedded with the repetitive additional information data therein.

2. A data transmission method for the information data transmitted through the method as claimed in claim 1, comprising, at a receiver side, the following steps:

a fourth step for receiving the transmitted information data embedded with the repetitive additional information data therein;

a fifth step for detecting the repetitive additional information data embedded from said transmitted information data received in the fourth step;

a sixth step for determining said additional information data based on a majority rule when receiving said information data; and a seventh step for correcting error with using the error correction codes received and determined when said additional information data contains error(s) therein.

3. A data transmission method as claimed in claim 1 or 2, wherein said information data includes at least one of video data, audio data and text data.

4. A data transmission method for information data containing additional information data therewith, comprising, at a transmitter side, the following steps:

a first step for encoding said additional information data in accordance with a predetermined conversion table;

a second step for embedding said additional information data encoded in the above step into the information data by plural times, repetitively; and a third step for transmitting the information data embedded with the repetitive additional encoded data therein.

5. A data transmission method for the information data transmitted through the method as claimed in claim 4, comprising, at a receiver side, the following steps:
- a fourth step for receiving the transmitted information data embedded with the repetitive additional information data encoded;
- a fifth step for detecting the repetitive additional information data encoded, which are embedded within the information data received;
- a sixth step for determining said encoded additional information data on a basis of a majority rule of the repetitive encoded additional information data detected; and
- a seventh step for decoding the encoded data into the additional information data.

6. A data transmission method as claimed in claim 4 or 5, wherein said information data includes at least one of video data, audio data and text data.

7. A data transmitting apparatus for transmitting information data containing additional information data therewith, comprising:
- a first means for adding error correction codes for correcting error to said additional information data;
- a second means for embedding the additional information data added with the error correction codes by said first means into the information data by plural times, repetitively; and
- a third means for transmitting the information data embedded with the repetitive additional information data therein.

8. A data transmitting apparatus as claimed in claim 7, wherein said third means includes means for recording the information data embedded with the repetitive additional information data onto an optical information recording medium.

9. A data reproducing apparatus for reproducing the transmitted information data transmitted by the data transmitting apparatus defined in claim 7, comprising:
- a first means for receiving the transmitted information data embedded with the repetitive additional information data therein;
- a second means for detecting the additional information data embedded from the transmitted information data received by said first means;
- a third means for determining said additional information data on a basis of a majority rule when receiving said information data; and
- a fourth means for correcting error with using the error correction codes received and determined when said additional information data contains error(s) therein.

10. A data transmitting apparatus for transmitting information data containing additional information data therewith, comprising:
- a first means for encoding said additional information data in accordance with a predetermined conversion table;
- a second means for embedding said additional information data encoded in the first means into the information data by plural times, repetitively; and
- a third means for transmitting the information data embedded with the repetitive additional encoded data therein.

11. A data transmitting apparatus as claimed in claim 10, wherein said third means includes means for recording the information data embedded with the repetitive additional information data onto an optical information recording medium.

12. A data reproducing apparatus for reproducing the transmitted information data transmitted by the data transmitting apparatus defined in claim 10, comprising:
- a first means for receiving the transmitted information data embedded with the repetitive additional information data encoded;
- a second means for detecting the repetitive additional information data encoded which are embedded within the information data received;
- a third means for determining said encoded additional information data on a basis of a majority rule of the repetitive encoded additional information data detected; and
- a fourth means for decoding the encoded data into the additional information data.

13. An information recording medium for recording data therein, comprising:
- information data being reproducible;
- additional information data which are embedded into said information data repetitively; and
- error correction codes which are added to said additional information data and also embedded into said information data repetitively.

14. An information recording medium as claimed in claim 13, wherein an information, relating to a repetition number of the additional information data embedded into said information data, is recorded into a part of said information recording medium.

* * * * *